United States Patent [19]

Kwan

[11] Patent Number: 5,309,349
[45] Date of Patent: May 3, 1994

[54] CURRENT DETECTION METHOD FOR DC TO THREE-PHASE CONVERTERS USING A SINGLE DC SENSOR

[75] Inventor: Khang-Shen Kwan, Hsinchu, Taiwan

[73] Assignee: Industrial Technology Research Institute, Hsinchu, Taiwan

[21] Appl. No.: 949,070

[22] Filed: Sep. 22, 1992

[51] Int. Cl.$^5$ ............................................. H02M 7/44
[52] U.S. Cl. ........................................ 363/98; 363/78; 363/17; 363/132
[58] Field of Search .................. 363/16, 78, 80, 89, 363/98, 17, 74, 79, 40, 41, 95, 97, 132, 56, 58; 323/299; 318/811

[56] References Cited

U.S. PATENT DOCUMENTS

| | | | |
|---|---|---|---|
| 4,099,225 | 7/1978 | Nygaard | 363/56 |
| 4,180,853 | 12/1979 | Scorso, Jr. et al. | 363/96 |
| 4,752,866 | 1/1988 | Huynh et al. | 363/138 |
| 4,788,485 | 11/1988 | Kawagishi et al. | 318/811 |
| 4,823,065 | 4/1989 | Gousset | 318/798 |
| 4,870,556 | 9/1989 | Inaba et al. | 363/41 |
| 4,896,242 | 1/1990 | Neft | 361/87 |
| 4,988,939 | 1/1991 | Reichard et al. | 318/800 |
| 5,084,812 | 1/1992 | Häusler et al. | 363/72 |
| 5,127,085 | 6/1992 | Becker et al. | 388/903 |
| 5,163,172 | 11/1992 | Hakala | 324/111 |
| 5,177,428 | 1/1993 | Hirose et al. | 323/207 |
| 5,177,677 | 1/1993 | Nakata et al. | 363/89 |
| 5,202,621 | 4/1993 | Reischer | 323/358 |
| 5,214,575 | 5/1993 | Sugishima et al. | 363/37 |

Primary Examiner—R. Skudy
Assistant Examiner—Ben Davidson
Attorney, Agent, or Firm—Marshall & Melhorn

[57] ABSTRACT

A current detection method for a direct-current (DC) to three-phase alternating-current (AC) converter can utilize only a single DC sensor to detect and calculate the three-phase alternating currents. The method can detect a direct current value of one phase at each of six different gate states of three pairs of transistors in the DC to three-phase AC converter by means of the DC sensor. In the two-level pulsewidth modulation control, the control signal includes a plurality of carrier periods each being subdivided into three intervals. The three pairs of transistors are switched to the zero state in one interval of each carrier period, and to two different gate states respectively in the two other intervals. The method can detect two current values of different phases respectively in the two other intervals of each carrier period, and then calculate the current value of the other phase in accordance with the principle that the sum of the three-phase currents is always equal to zero.

12 Claims, 7 Drawing Sheets

CURRENT DETECTION METHOD FOR DC TO THREE-PHASE CONVERTERS USING A SINGLE DC SENSOR

BACKGROUND OF THE INVENTION

The present invention relates generally to a current detection method for a converter, and particularly to a current detection method for a direct-current (DC) to three-phase alternating-current (AC) converter. The method can utilize only a single DC sensor to detect and calculate the three-phase alternating currents.

Figure 1:
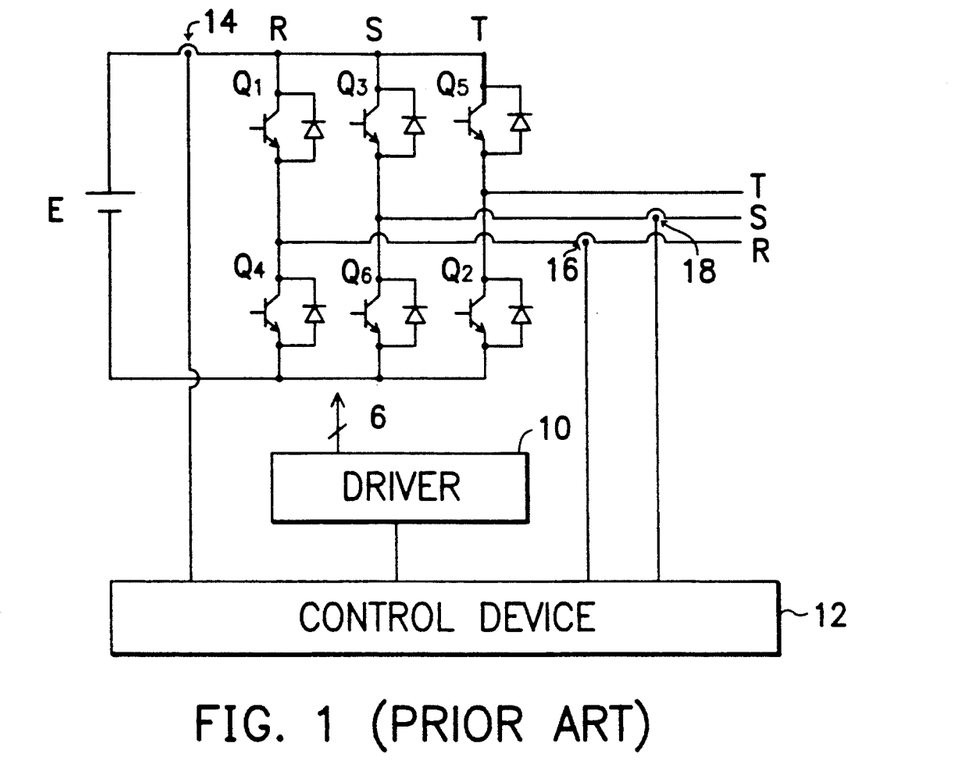
FIG. 1 is a schematic diagram of the basic electrical circuit of a conventional DC to three-phase AC converter.

Conventional converters typically have protection means for detecting over-current and over-load conditions, and for protecting the converters from damage when such conditions occur. In conventional DC to three-phase AC converters, a DC sensor and two AC sensors have to be used in order to detect the over-current and three-phase alternating currents respectively. With reference to FIG. 1, the basic circuit of a general DC to three-phase AC converter is shown. As shown in the drawing, the converter converts a DC source E into three-phase alternating currents T, S, and R which are then connected to a load (not shown), such as an induction motor. The basic circuit includes six transistors $Q_1$ to $Q_6$, and a driver 10 controlling the ON/OFF states of the transistors $Q_1$ to $Q_6$ to achieve the conversion purpose. The basic circuit further must include a DC sensor 14 for detecting the over-current to actuate a control device 12 to protect the converter, and two AC sensors 16 and 18 to detect the load currents. The sensors 14, 16, and 18 are very expensive, and thus comprise a large part of the cost of the converter.

SUMMARY OF THE INVENTION

Therefore, the primary object of the present invention is to provide a current detection method for a DC to three-phase AC converter. The method needs only a single DC sensor to detect the three-phase alternating currents, and thus the system structure of the converter is significantly simplified, resulting in a large reduction in cost.

In accordance with the present invention, a current detection method for a direct-current to three-phase alternating-current converter wherein the converter includes a direct-current sensor for detecting its direct-current, and three pairs of transistors for controlling its three-phase alternating-currents, the method comprises the steps of:

(a) controlling the switching of the gate states of the three pairs of transistors;

(b) detecting two current values of different phases respectively at two different gate states of the three pairs of transistors by means of the direct-current sensor; and (c) calculating the current value of the other phase by means of the two detected current values of different phases.

BRIEF DESCRIPTION OF THE DRAWINGS

The present invention can be more fully understood by reference to the following description and accompanying drawings, which form an integral part of this application:

FIGS. 4a to 4f are schematic diagrams showing six current paths at the gate state of FIG. 2a;

DETAILED DESCRIPTION OF THE PREFERRED EMBODIMENTS

Figure 2:
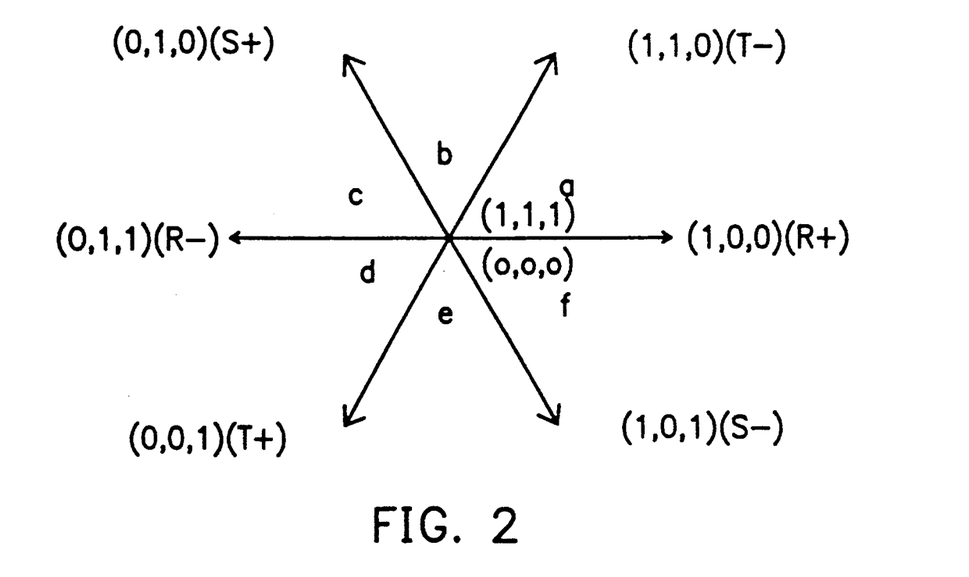
FIG. 2 is a schematic diagram of the voltage vectors of the basic circuit shown in FIG. 1.
Figure 2A:
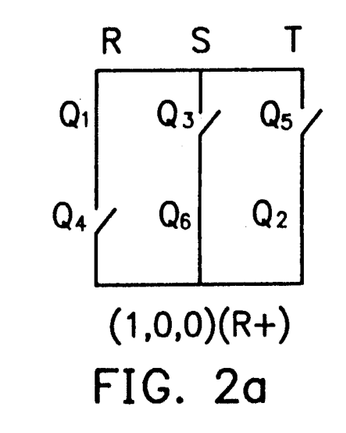
FIGS. 2a to 2f show six ON/OFF state combinations of the six transistors in the basic circuit shown in FIG. 1.
Figure 2B:
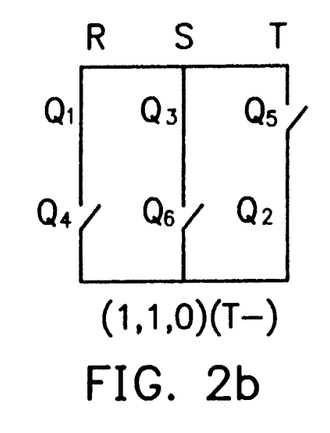
Figure 2C:
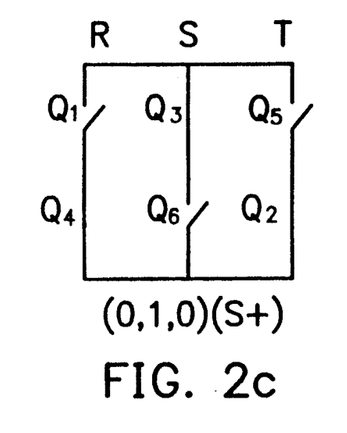
Figure 2D:
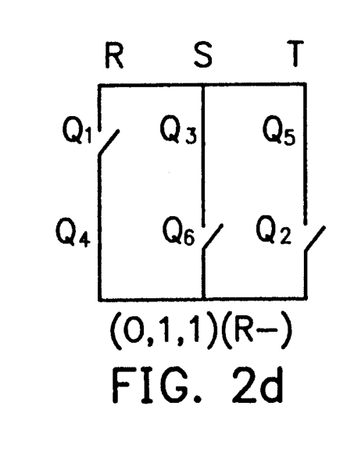
Figure 2E:
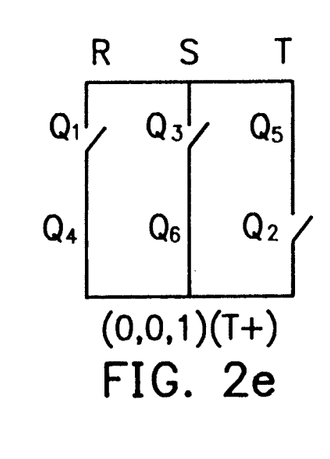
Figure 2F:
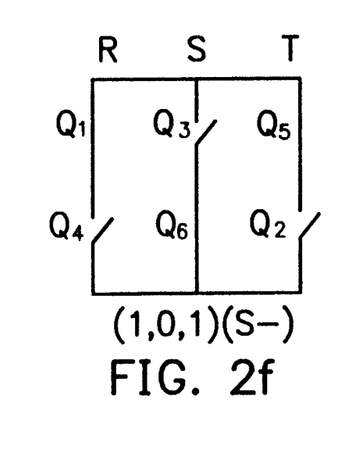
Figure 3:
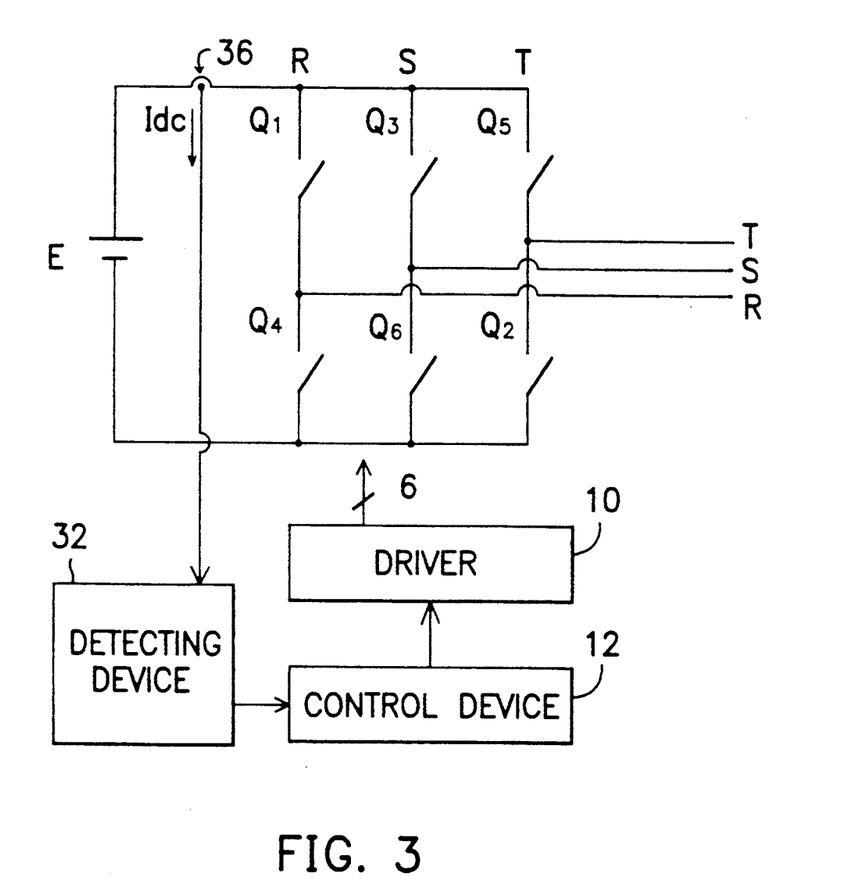
FIG. 3 is a schematic diagram of one example of a DC to three-phase AC converter utilizing the current detection method of the present invention.
Figure 4A:
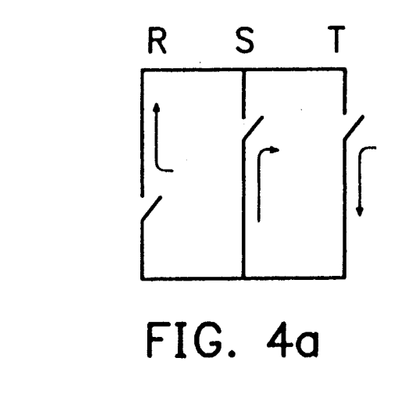
Figure 4B:
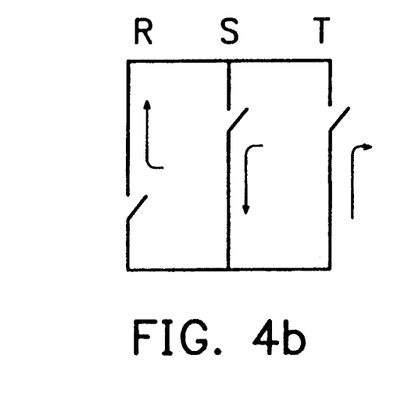
Figure 4C:
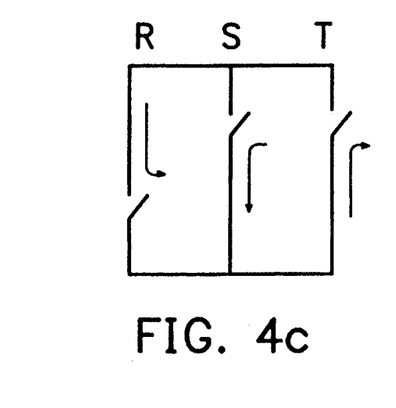
Figure 4D:
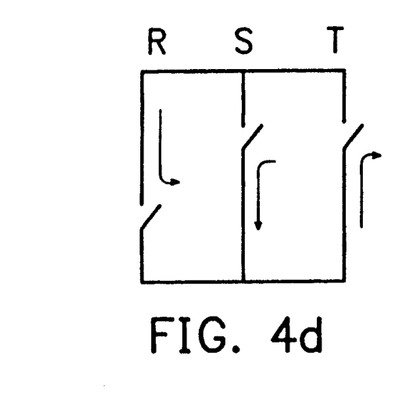
Figure 4E:
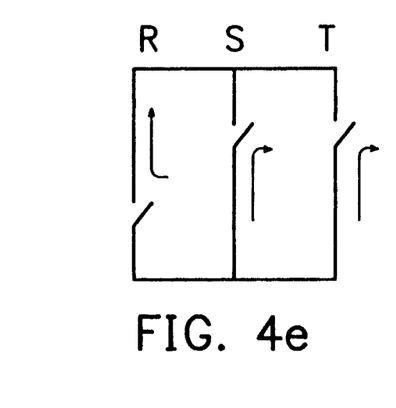
Figure 4F:
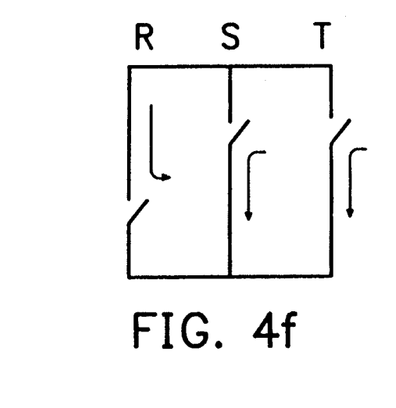
Figure 5A:
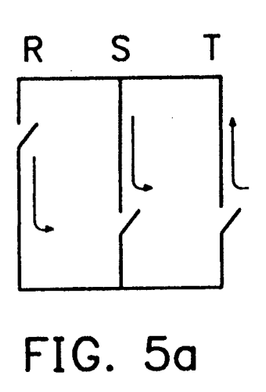
FIGS. 5a to 5f are schematic diagrams showing six current paths at the gate state of FIG. 2d.
Figure 5B:
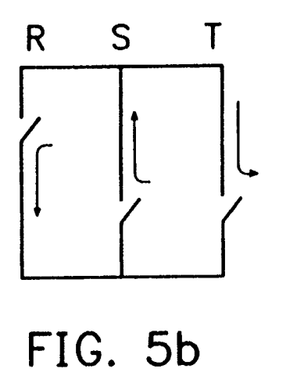
Figure 5C:
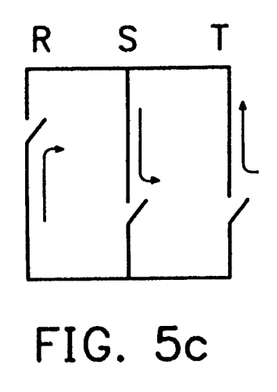
Figure 5D:
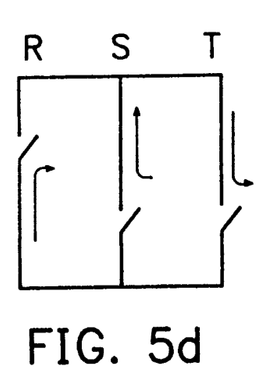
Figure 5E:
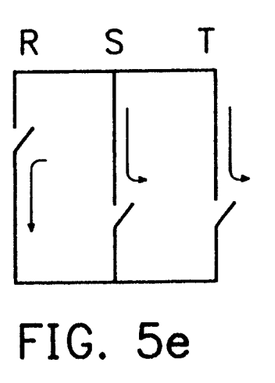
Figure 5F:
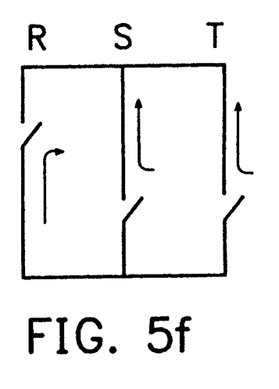

In order to easily understand the method of the present invention, the basic principle of a direct-current (DC) to three-phase alternating-current (AC) converter is firstly described. Referring to FIG. 1 or 3, the converter includes three pairs of transistors $Q_1$, $Q_4$; $Q_3$, $Q_6$; and $Q_5$, $Q_2$, and a driver 10 controlling the ON/OFF states of the transistors $Q_1$ to $Q_6$ in order to convert a DC source E into three-phase alternating currents T, S, and R. Please note that the transistors $Q_1$ to $Q_6$ shown in FIGS. 2a to 2f, 3, 4a to 4f, and 5a to 5f are indicated as switches for ease of illustration. In the circuit of the converter, the transistor pair $Q_1$ and $Q_4$ controls the voltage of the R phase; the transistor pair $Q_3$ and $Q_6$ controls the voltage of the S phase; and the transistor pair $Q_5$ and $Q_2$ controls the voltage of the T phase. The transistors $Q_1$, $Q_3$, and $Q_5$ are defined as positive gates while the transistors $Q_4$, $Q_6$, and $Q_2$ are defined as negative gates. In the general voltage control, such as two-level pulsewidth modulation control, the conduction time of the positive gate in each phase are usually complementary with that of the negative gate. That is to say, when the positive gate is ON, the negative gate is always OFF, and vice versa. Thus, the gate state of each phase can be represented by the binary codes, i.e. 0 and 1. The code 0 represents that the positive gate is OFF while the negative gate is ON. The code 1 represents that the positive gate is ON while the negative gate is OFF. In accordance with such a definition, there are eight combinations of the gate states in three-phases R, S, and T, and the three-phase gate states can be represented by three codes. For example, the code combination (1, 0, 0) represents that the transistor $Q_1$ of the R phase is ON while the transistor $Q_4$ is OFF; the transistor $Q_3$ of the S phase is OFF while the transistor $Q_6$ is ON; and the transistor $Q_5$ of the T phase is OFF while the transistor $Q_2$ is ON. It should be noted that there are two three-phase gate states wherein the gate states in three phases are all the same, i.e. (0, 0, 0) and (1, 1, 1). In these two three-phase gate states, the three-phase AC end in the circuit is in a short state while the DC end is in an open state, resulting in no voltage. Thus, these gate states are defined as the zero state. The other six states besides the zero state are shown in FIGS. 2a to 2f respectively. Furthermore, they can be represented by the voltage vectors. As shown in FIG. 2, the zero state is at the origin, and the other six gate states are represented respectively by six vectors. Each two adjoining vectors of the six vectors are separated by sixty degrees, and the regions between each two adjoining vectors are labeled as regions a to f. Since these are all general principles of the so-called space vector control, it is not necessary to describe them further.

Referring now to FIGS. 2, and 2a to 2f, in each of the six three-phase gate states, there must be one of the positive gates $Q_1$, $Q_3$, and $Q_5$, or one of the negative gates $Q_4$, $Q_6$, and $Q_2$ in the ON state individually with respect to the other two gates. For example, in the first state shown in FIG. 2a, the transistor $Q_1$ is ON individually with respect to the transistors $Q_3$ and $Q_5$, and this is indicated by the symbol R+. In the second state shown in FIG. 2b, the transistor $Q_2$ is ON, as indicated by the symbol T−. In the third state shown in FIG. 2c, the transistor $Q_3$ ON, as indicated by S+. In the fourth state shown in FIG. 2d, the transistor $Q_4$ ON, as indicated by R−. In the fifth state shown in FIG. 2e, the transistor $Q_5$ ON, as indicated by T+. In the sixth state shown in FIG. 2f, the transistor $Q_6$ ON, as indicated by S−. Thus, the current instantaneously flowing through the turned-on gate is direct current.

Basically, the six gate states described above are symmetrical. Therefore, once all of the current paths in one of the gate states are described, the current paths of the other gate states can be easily inferred. With reference to FIGS. 4a to 4f, there are shown all of the current paths in the first gate state shown in FIG. 2a. Also referring to FIG. 3, it can be seen that the direct current $I_{dc}$ is equal to the current flowing out of the R phase, and thus can be defined as $I_R=I_{dc}$. With reference to FIGS. 5a to 5f, there are shown all of the current paths in the fourth gate state shown in FIG. 2d. Also referring to FIG. 3, it can be seen that the direct current, $I_{dc}$ is equal to the current flowing into the R phase, and thus can be defined as $I_R=-I_{dc}$. According to the same principle, it can be inferred that $I_T=-I_{dc}$ in the second gate state of FIG. 2b; $I_T=I_{dc}$ in the fifth gate state of FIG. 2e; $I_S=I_{dc}$ in the third gate state of FIG. 2c; and $I_S=-I_{dc}$ in the sixth gate state of FIG. 2f. For the sake of convenience, the first to sixth gate states are labeled by the symbols R+, T−, S+, R−, T+, and S− respectively to represent the definition of the current flowing directions described above, as shown in FIGS. 2 and 2a to 2f. Furthermore, the sum of the three-phase alternating currents must be equal to zero, i.e. $I_R+I_S+I_T=0$, in accordance with the circuit loop shown in FIG. 1 or 3.

Referring now to FIG. 3, there is shown a DC to three-phase AC converter utilizing the current detection method of the present invention. The circuit of FIG. 3 is quite similar to the circuit of FIG. 1. The difference therebetween is that the converter of FIG. 3 utilizes only a single DC sensor 36 connected to a detecting device 32 while omitting the two AC sensors 16 and 18 shown in FIG. 1. The detecting device 32 of the converter shown in FIG. 3 receives the direct current $I_{dc}$ sensed by the DC sensor 36, and calculates the three-phase currents $I_R$, $I_S$, and $I_T$ according to the method of the present invention. The detecting device 32 is also coupled to a control device 12 to obtain the information about the ON/OFF states of the transistors $Q_1$ to $Q_6$.

Figure 7A:
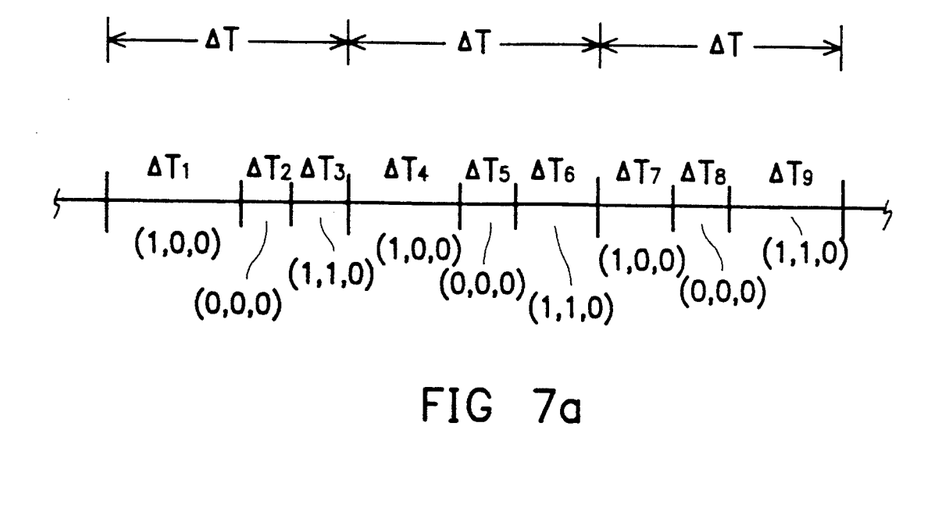
FIG. 7a shows one descriptive example of the switching of the gate states in three carrier periods of the pulsewidth modulation control signal.

In order to clearly understand the method of the present invention, the specification utilizes the above-mentioned space vector control method which controls the transistors or gates by means of the pulsewidth modulation (PWM) technique to describe the current detection method of the present invention. However, it should be understood that the present invention is not intended to be limited to the space vector control application. The gate control signal in the PWM control is divided into a plurality of short time units called as carrier periods. Each carrier period is subdivided into three intervals each representing the duration of one gate state output. Therefore, there are three gate state outputs within each carrier period, and one of the gate state output is selected as the zero state (0, 0, 0) or (1, 1, 1) while the other two gate states is selected from the above-described six gate states. The selection manner will be described in detail hereinafter. With reference to FIG. 2, the shown angles represent the phase angles of the three-phase AC voltages in accordance with the concept of the space vector. Thus, during operation, it can be envisioned that an imaginary pointer rotates in a counterclockwise direction. Its rotation frequency is just equal to the frequency of the three-phase AC voltage. The voltage vectors within the region a, b, c, d, e, or f of FIG. 2 can be formed by means of the voltage vectors of the two gate states adjacent that region. For example, all of the voltage vectors in region a can be formed by means of the R+ and T− voltage vectors; all of the voltage vectors in region b can be formed by means of the T− and S+ voltage vectors; and so on. Referring to FIGS. 3 and 7a, there is shown one example of three carrier periods ΔT of the PWM signal in region a. In each carrier period, two gate states are selected as the R+ (1, 0, 0) and T− (1, 1, 0) gate states, and the other is selected as the zero state. The durations of the three gate states are varied to form the different voltage output. It should be noted that the width variations of the intervals Δt1 to Δt9 shown in FIG. 7a has been exaggerated for the sake of clarity. In the actual application, the width variation would be smaller, depending on the desired formation of the output voltage. In accordance with the method of the present invention and the circuit of FIG. 3, the direct current $I_{dc}$ sensed by the DC sensor 36 in the interval Δt1 is equal to the $I_R$, i.e. $I_R=I_{dc}$; there is no current in the interval Δt2; and the direct current $I_{dc}$ sensed by the DC sensor 36 in the interval Δt3 is equal to the $-I_T$, i.e. $I_T=-I_{dc}$. In this carrier period ΔT, the currents $I_R$ and $I_T$ are sensed, and then the detecting device 32 can calculate the current $I_S$ in accordance with the following equation:

$$I_R+I_S+I_T=0.$$

According to the same principle, the three-phase alternating-currents $I_R$, $I_S$, and $I_T$ can be detected and calculated in each of the other carrier periods, such as in the intervals Δt4 to Δt6 or Δt7 to Δt9.

Figure 7B:
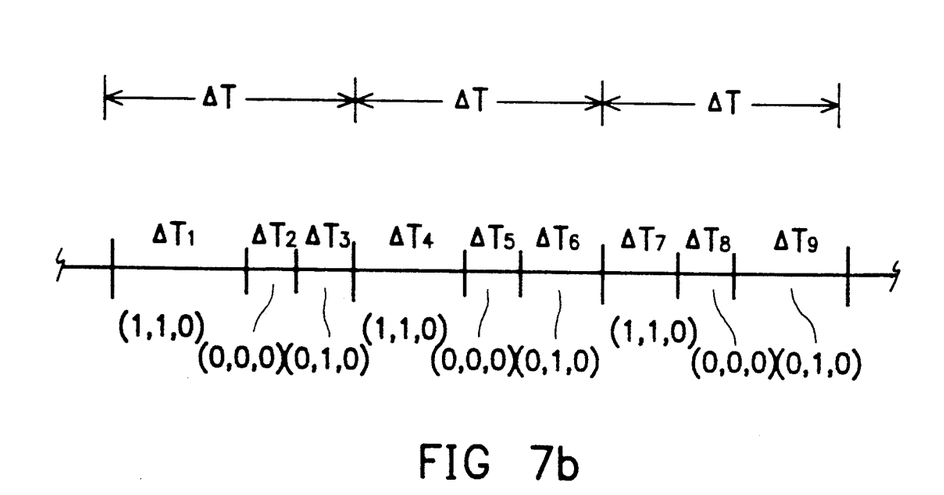
FIG. 7b shows another descriptive example of the switching of the gate states in three carrier periods of the pulsewidth modulation control signal.

Referring now to FIGS. 3 and 7b, there is shown one example of three carrier periods ΔT of the PWM signal in the region b. In each carrier period, two gate states are selected as the T− (1, 1, 0) and S+ (0, 1, 0) gate states, and the other is selected as the zero state. In accordance with the method of the present invention and the circuit of FIG. 3, the direct current $I_{dc}$ sensed by the DC sensor 36 in the interval Δt1 is equal to $-I_T$, i.e. $I_T=-I_{dc}$; there is no current in the interval Δt2; and the direct current $I_{dc}$ sensed by the DC sensor 36 in the interval Δt3 is equal to $I_S$, i.e. $I_S=I_{dc}$. In this carrier period ΔT, the currents $I_T$ and $I_S$ are sensed, and then the detecting device 32 can calculate the current $I_R$. In the same principle, the three-phase alternating-currents $I_R$, $I_S$, and $I_T$ can be detected and calculated in each of the other carrier periods.

The current detection method and principle in the other regions c to f are the same, thus it is unnecessary to describe them further. Therefore, in accordance with the method of the present invention, only a single DC sensor 36 is needed to detect the three-phase alternating currents at the carrier frequency.

Figure 6:
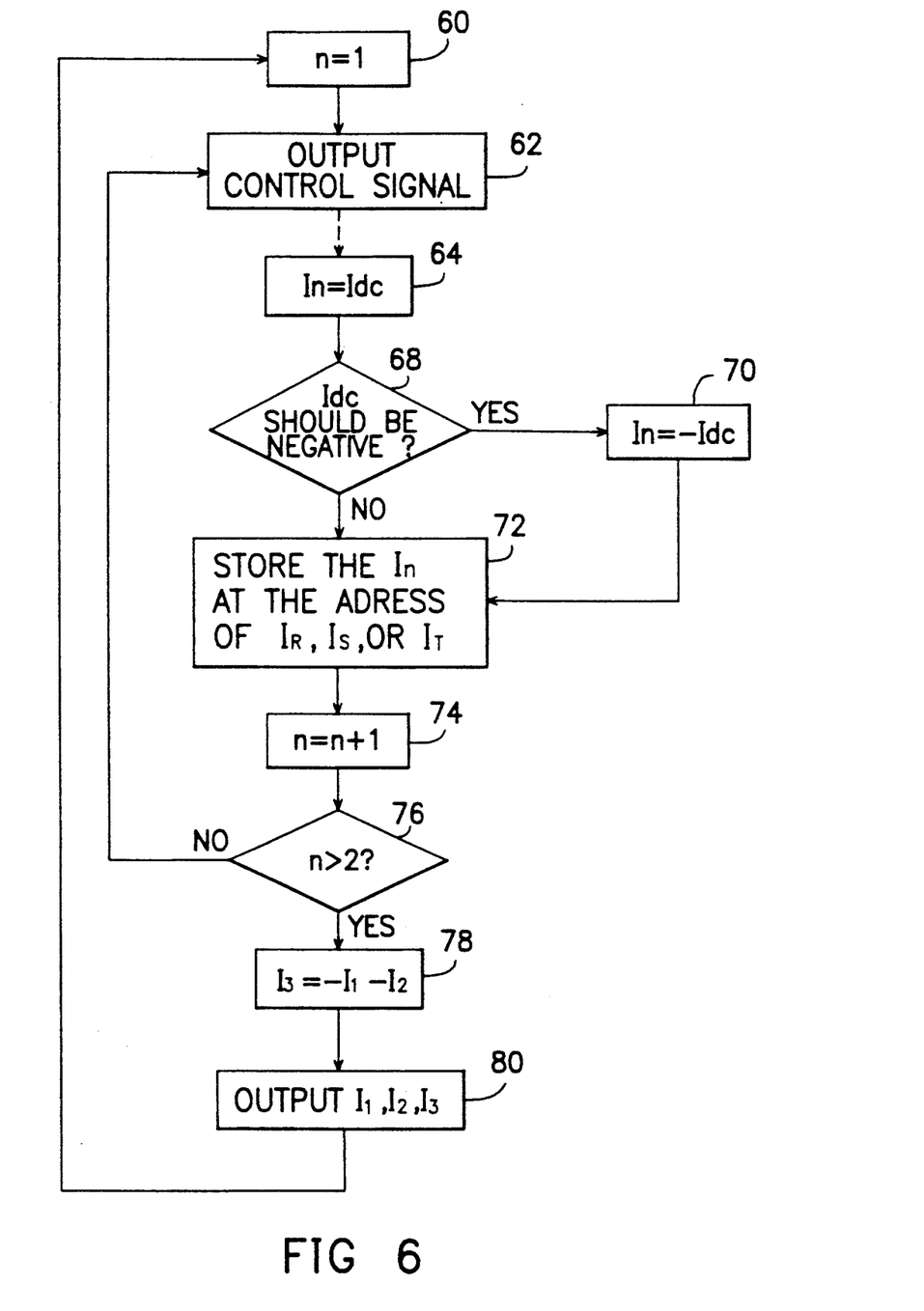
FIG. 6 is a flow chart of a current detection method in accordance with one preferred embodiment of the present invention.

In accordance with the method of the present invention, the detecting device 32 of FIG. 3 can be a microprocessor incorporating appropriate software, and can be integrated within the control device 12. With reference to FIG. 6, there is shown a flowchart of the requisite software. Firstly, the parameter n is reset to one, as shown in the block 60. Then, the control signal is output to the driver 10 to switch the the gate state of the transistors $Q_1$ to $Q_6$, as shown in the block 62. The detecting device 32 receives the direct current $I_{dc}$ sensed by the DC sensor 36, and lets $I_n = I_{dc}$, as shown in the block 64. In accordance with the control signal output in the block 62, a determination of whether the $I_{dc}$ should be changed to a negative value or not is made in the decision block 68. For example, the $I_{dc}$ should be changed to a negative value in the block 70 if the transistors $Q_1$ to $Q_6$ are currently at the second gate state $T-$ (1, 1, 0), the fourth gate state $R-$ (0, 1, 1), or the sixth gate state $S-$ (1, 0, 1). In accordance with the control signal output in the block 62, it can be realized that the direct current $I_{dc}$ currently sensed by the DC sensor 36 belongs to the three-phase current $I_R$, $I_S$, or $I_T$, and thus the value $I_n$ is stored at the adequate address representing the $I_R$, $I_S$, or $I_T$ in the block 72. The parameter n is increased by one in the block 74, and a determination whether the parameter n is over two or not is made in the decision block 76. If it is not over two, the steps from the blocks 62 to 74 are repeated again to further detect another direct current in the same carrier period. If yes, this means that two direct currents $I_1$ and $I_2$ have been detected in one carrier period. Thus, the other direct current $I_3$ can be calculated in the block 78, i.e. $I_3$ is equal to $-I_1-I_2$ in accordance with the above-mentioned equation $I_R + I_S + I_T = 0$. The current values of the $I_1$, $I_2$, and $I_3$, i.e. the values of the three-phase alternating currents $I_R$, $I_S$, and $I_T$, are output in the block 80. In this way, the current detection for one carrier period is completed. Then, the blocks from 60 to 80 are repeated once more for the current detection of next carrier period.

In the example described in FIG. 6, the three-phase alternating currents $I_R$, $I_S$, and $I_T$ are detected once in one carrier period. That is to say, the first and second sensed currents of two phases are utilized to calculate the current value of the other phase; the third and fourth sensed currents of two phases are utilized to calculate the current value of the other phase; and so on. However, the present invention is not intended to be limited to this. For example, any two adjoining sensed currents can be utilized to calculate the current value of the other phase. That is to say, the second and third sensed currents can also be utilized to calculate the current value of the other phase. This totally depends on the application. Since the carrier period is very short generally, the current value calculated in this way can be treated as a correct value.

The method of the present invention can also be achieved by an electronic circuit instead of the microprocessor incorporating the requisite software. Since such an electronic circuit can be designed easily by those skilled in the art in accordance with the method of the present invention, this is deemed unnecessary to be further described. Furthermore, the electronic circuit designed in accordance with the present invention can be configured as an ASIC or hybrid IC the cost of which could be very low as known in the art.

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A current detection method for a direct-current to three-phase alternating-current converter wherein said converter includes a direct current power supply, a direct-current sensor for detecting direct-current on the direct current side of the converter, three pairs of transistors for converting the direct current power supply to a three phase alternating current power supply, and a control means to control a sequenced switching of the transistors and the resulting three-phase alternating-currents, said method comprising the steps of:
   (a) controlling the switching of said three pairs of transistors;
   (b) detecting direct current values in the direct current side of the converter corresponding to the phase current of a first phase and a second phase by means of said direct-current sensor; and
   (c) calculating a phase current value for a third phase by means of said detected current values of the first and second phases.

2. A current detection method as claimed in claim 1, wherein said controlling of the switching of the three pairs of transistors includes generating a two-level pulsewidth modulation control signal to control the switching of each pair of transistors.

3. A current detection method as claimed in claim 2, wherein said controlling the switching of the three pairs of transistors includes the steps of:
   producing a two-level pulsewidth modulation control signal including a plurality of carrier periods, each carrier period having three switching intervals;
   controlling the switching of each pair of transistors at a zero state in a first interval of each carrier period; and
   controlling the switching of each pair of transistors at two different operating states in second and third intervals of each carrier period.

4. A current detection method as claimed in claim 3, wherein said detecting two direct current values in the direct current side of the converter corresponding to the phase current of a first phase and a second phase includes the step of:
   monitoring the operating and zero states of the three pairs of transistors during the three intervals of each carrier period;
   detecting said direct current values of the two operating states during each carrier period by means of said direct current sensor.

5. The current detection method as claimed in claim 3 wherein the step of controlling the switching of each pair of transistors includes transmitting a zero state and two operating states of a space vector control system by utilizing the pulsewidth modulated signals generated by the control means.

6. The current detection method as claimed in claim 1 wherein calculating a phase current value for a third phase ($I_3$) by means of said detected current values of the first and second phases ($I_1 + I_2$) includes inserting the detected current values for the two known phases into the equation $I_1 + I_2 + I_3 = 0$ and solving the equation for the value of the third phase.

7. A current detection method for a direct current to three-phase alternating current converter wherein said converter includes a direct current power supply, a direct current sensor for detecting current on the direct current side of the converter, three pairs of transistors for converting the direct current power supply to a three phase alternating current power supply, a driver to control a sequenced switching of the transistors to generate the three-phase alternating currents, and a detecting device for determining and monitoring the direct current and the three phase currents in the converter, said method comprising the steps of:

(a) generating a pulsewidth modulation control signal with a pluarlity of space vector designations to control the switching of said three pairs of transistors and produce a three phase alternating current output;

(b) detecting a first direct current value ($I_1$) in the direct current side of the converter corresponding to the phase current of a first phase of said three pairs of transistors;

(c) monitoring the state of the three pair of transistors to distinguish the first phase, and storing the first direct current value in the detecting device;

(d) detecting a second direct current value ($I_2$) in the direct current side of the converter corresponding to the phase current of a second phase of said three pairs of transistors;

(e) monitoring the state of the three pair of transistors to distinguish the second phase, and storing the second direct current value in the detecting device;

(f) calculating a third phase current value ($I_3$) by solving the equation $I_1 + I_2 + I_3 = 0$ for the third phase current value.

8. A current detection method as claimed in claim 7, wherein the step of generating a pulsewidth modulated control signal includes generating a signal having a plurality of carrier periods for controlling the switching of the pairs of transistors, each carrier period including two variable-length operating intervals and one variable zero state intervals, whereby the state of the transistors is monitored and the value of the current is detected for the first phase and the second phase during the two operating intervals of the carrier period.

9. A current detection method as claimed in claim 8, wherein the method includes the additional steps of repeating the process for determining all three phase currents for each carrier period.

10. An apparatus for determining currents in a six transistor DC to AC converter, including measurement of the direct current in a DC circuit of the converter, measurement of two alternating current phases, and calculation of a third alternating current phase in an AC circuit of the converter, said apparatus comprising:

(a) a DC current sensor mounted on the DC circuit of the converter for measuring the direct current in the DC circuit of the converter and for generating an output signal;

(b) driver means electrically connected to six transistors in the converter for controlling the on-off switching of the six transistors in the converter by the generation of a pulsewidth modulated signal;

(c) control means for processing and transmitting control signals, said control means being connected to said driver means to control the sequencing of the transistors to generate a desired AC output, and including an over current protection circuit to protect the converter; and (d) a detecting device electrically connected to said DC current sensor and said control means, said detecting device including a processing means for processing signals from the DC current sensor and for processing signals from said control means, whereby said control means sequences the switching of the transistors in the converter to permit indirect current measurement of a first and a second alternating current phase by said DC current sensor, and calculation of a third alternating current phase by the processing means in said detecting device.

11. The apparatus defined in claim 10 wherein the processing means in said detecting device includes a microprocessor with appropriate software for storing information about two of the alternating current phases, and calculating the third alternating current phase.

12. The apparatus defined in claim 10 wherein the processing means in said detecting device includes an integrated circuit.

* * * * *